US010694586B2

(12) United States Patent
Schulz et al.

(10) Patent No.: US 10,694,586 B2
(45) Date of Patent: Jun. 23, 2020

(54) TRANSPARENT PANE HAVING A HEATABLE COATING

(71) Applicant: SAINT-GOBAIN GLASS FRANCE, Courbevoie (FR)

(72) Inventors: Valentin Schulz, Niederzier (DE); Guenther Schall, Kreuzau (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 823 days.

(21) Appl. No.: 15/302,454

(22) PCT Filed: Mar. 5, 2015

(86) PCT No.: PCT/EP2015/054567
§ 371 (c)(1),
(2) Date: Oct. 6, 2016

(87) PCT Pub. No.: WO2015/158462
PCT Pub. Date: Oct. 22, 2015

(65) Prior Publication Data
US 2017/0019955 A1   Jan. 19, 2017

(30) Foreign Application Priority Data

Apr. 17, 2014  (EP) .................................... 14165092

(51) Int. Cl.
*H05B 3/84*   (2006.01)
*B32B 17/10*   (2006.01)
(Continued)

(52) U.S. Cl.
CPC ......... *H05B 3/84* (2013.01); *B32B 17/10036* (2013.01); *B32B 17/10183* (2013.01);
(Continued)

(58) Field of Classification Search
CPC ........ B32B 17/10036; B32B 17/10183; B32B 17/10385; B32B 2255/00; B32B 2419/00;
(Continued)

(56) References Cited

U.S. PATENT DOCUMENTS 6,559,419 B1 * 5/2003 Sol ................... B32B 17/10192
219/203
2002/0045037 A1   4/2002 Boire et al.
(Continued)

FOREIGN PATENT DOCUMENTS

| CN | 101909881 A | 12/2010 |
|---|---|---|
| CN | 102474912 A | 5/2012 |

(Continued)

OTHER PUBLICATIONS

International Search Report for PCT/EP2015/054567 filed on behalf of Saint-Gobain Glass France, dated Apr. 14, 2015. 3 pages.

*Primary Examiner* — Dana Ross
*Assistant Examiner* — James F Sims, III
(74) *Attorney, Agent, or Firm* — Pillsbury Winthrop Shaw Pittman LLP

(57) ABSTRACT

A transparent pane having an electrically heatable coating and at least one coating-free zone that can be used, for example, as communication window, is presented. The electrically heatable coating is connected to two collecting electrodes, such that a supply voltage applied to the electrodes generates a heating current that flows via a heating field formed between the collecting electrodes, the heating field containing the coating-free zone whose zone-edge is formed, at least in sections, by the heatable coating. Other implementation details include provision of two electrical supply lines electrically connecting the two collecting electrodes to separate subdivisions of an additional electrode. In one case, the electrical supply lines run, at least in sections, in the heating field, in the coating-free zone, in a coating-free (Continued)

edge strip, in a subregion of the coating outside the heating field, and/or in the zone-edge. Methods for producing the transparent pane are also presented.

8 Claims, 11 Drawing Sheets

(51) Int. Cl.
  *H05B 3/86* (2006.01)
  *C23C 14/35* (2006.01)
(52) U.S. Cl.
  CPC ........ *B32B 17/10385* (2013.01); *C23C 14/35* (2013.01); *H05B 3/86* (2013.01); *B32B 2255/00* (2013.01); *B32B 2419/00* (2013.01); *B32B 2479/00* (2013.01); *B32B 2605/08* (2013.01); *H05B 2203/003* (2013.01); *H05B 2203/004* (2013.01); *H05B 2203/007* (2013.01); *H05B 2203/008* (2013.01); *H05B 2203/011* (2013.01); *H05B 2203/013* (2013.01)
(58) Field of Classification Search
  CPC . B32B 2479/00; B32B 2605/08; C23C 14/35; H05B 2203/003; H05B 2203/004; H05B 2203/007; H05B 2203/008; H05B 2203/011; H05B 2203/013; H05B 3/84; H05B 3/86
  USPC .................................. 219/522, 547
  See application file for complete search history.

(56) References Cited

U.S. PATENT DOCUMENTS

| 2011/0108537 | A1 | 5/2011 | Schall |
| 2012/0103961 | A1 | 5/2012 | Offermann et al. |
| 2012/0193341 | A1 | 8/2012 | Reul et al. |
| 2013/0213949 | A1 | 8/2013 | Lisinski et al. |

FOREIGN PATENT DOCUMENTS

| CN | 102812775 A | 12/2012 |
| CN | 203027514 U | 6/2013 |
| DE | 102008018147 A1 | 10/2009 |
| DE | 102008029986 A1 | 1/2010 |
| DE | 202008017611 U1 | 4/2010 |
| EP | 0847965 A1 | 6/1998 |
| EP | 2334141 A1 | 6/2011 |
| FR | 2592544 A1 | 7/1987 |
| GB | 2381179 A | 4/2003 |
| JP | H06-13060 U | 2/1994 |
| JP | 2003-163071 A | 6/2003 |
| JP | 2013-541138 A | 11/2013 |
| JP | 2013-541807 A | 11/2013 |
| WO | WO 03/015473 A2 | 2/2003 |
| WO | 2011006743 A1 | 1/2011 |
| WO | 2012031907 A1 | 3/2012 |
| WO | 2012031908 A1 | 3/2012 |
| WO | 2012052315 A1 | 4/2012 |

\* cited by examiner

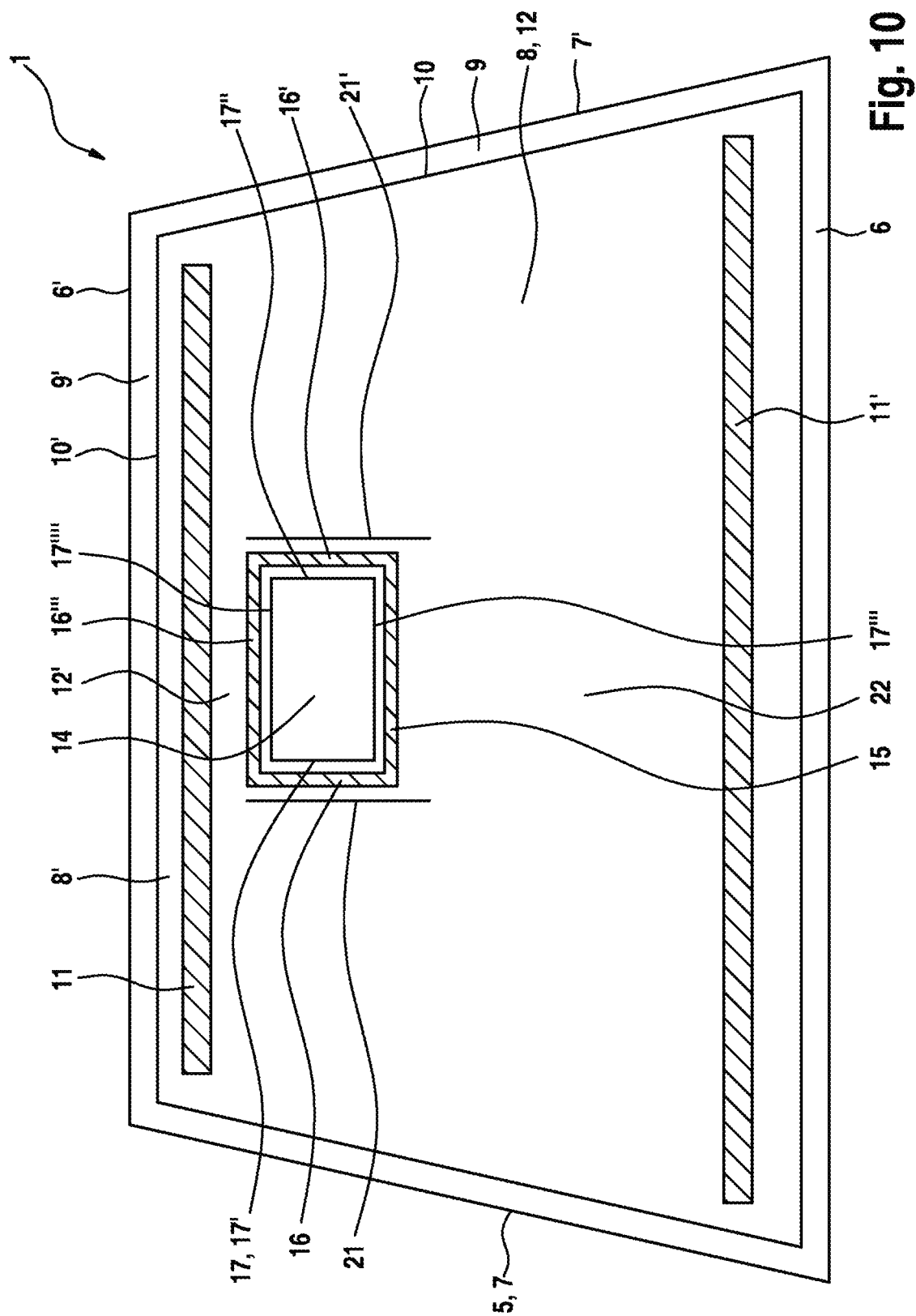

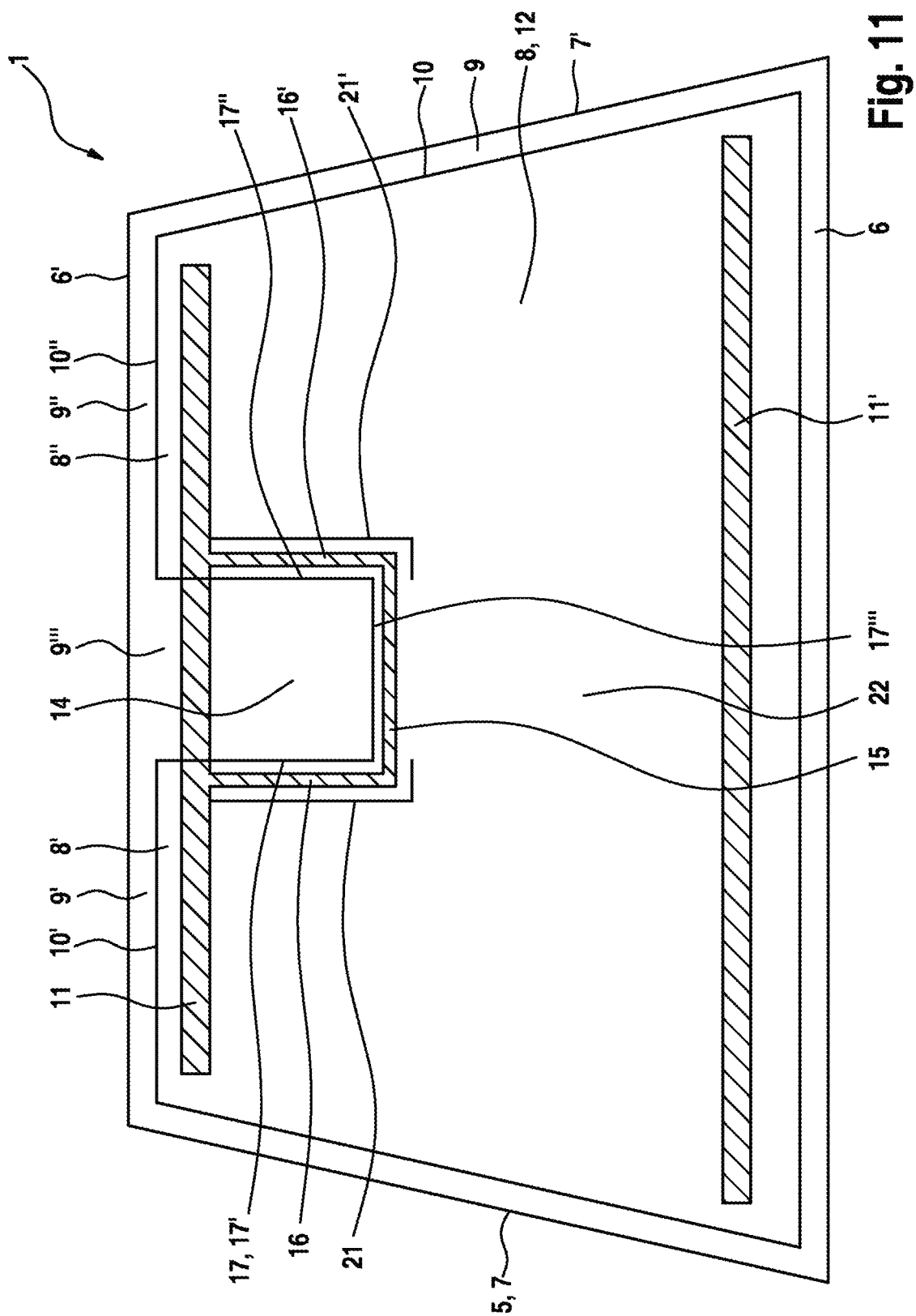

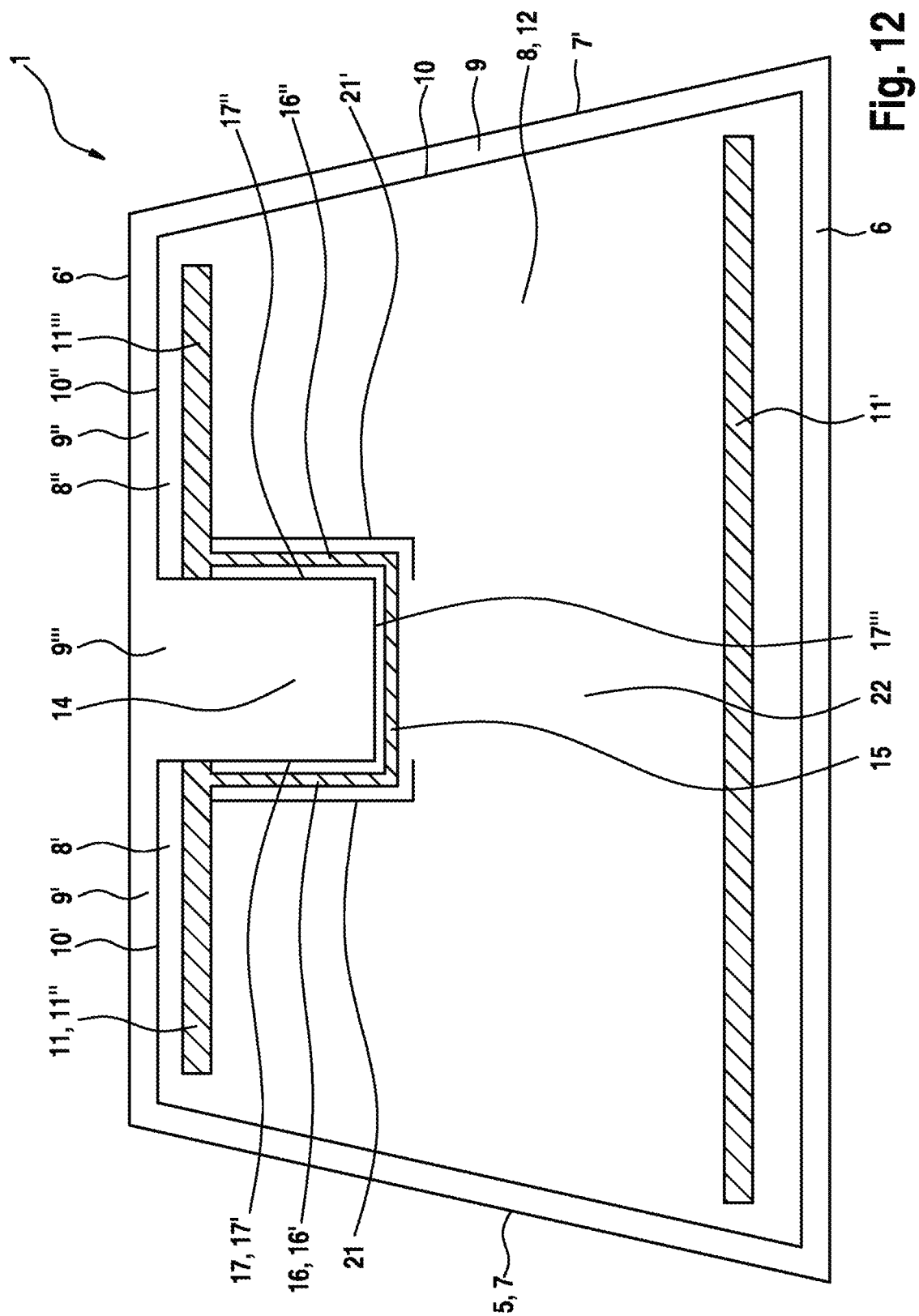

TRANSPARENT PANE HAVING A HEATABLE COATING

CROSS-REFERENCE TO RELATED APPLICATIONS

The present application is the U.S. National Stage of International Patent Application No. PCT/EP2015/054567 filed on Mar. 5, 2015 which, in turn, claims priority to European Patent Application No. 14165092.9 filed on Apr. 17, 2014.

The invention relates generically to a transparent pane having an electrically heatable coating.

Moreover, the invention relates to a method for producing a transparent pane.

Transparent panes having an electrical heating layer are well known per se and have already been described many times in the patent literature. Merely by way of example, reference is made in this regard to the German published patent applications DE 102008018147 A1 and DE 102008029986 A1. In motor vehicles, they are frequently used as windshields, since, by law, the central visual field must have no vision restrictions, with the exception of heating wires. By means of the heat generated by the heating layer, condensed moisture, ice, and snow can be removed in a short time. Usually, such panes are produced as composite panes, in which two individual panes are bonded to one another by a thermoplastic adhesive layer. The heating layer can be applied on one of the inner surfaces of the individual panes, with, however, other structures also known, wherein the heating layer is situated on a carrier that is arranged between the two individual panes.

The heating layer is usually electrically connected to at least one pair of strip- or band-shaped collecting electrodes ("busbars"), which are intended to introduce the heating current as uniformly as possible into the coating and to distribute it widely. For an attractive aesthetic appearance of the pane, the nontransparent collecting electrodes are covered by opaque masking strips.

In general, the specific heating output $P_{spec}$ of a heatable coating can be described by the formula $P_{spec}=U^2/(R_\square \times D^2)$, where U is the feed voltage, $R_\square$ is the electrical sheet resistance of the coating, and D is the distance between the two collecting electrodes. The sheet resistance $R_\square$ of the coating is, with the materials currently used in industrial series production, on the order of a few ohms per square unit of area ($\Omega/\square$).

In order to obtain a satisfactory heating output for the desired purpose with the onboard voltage of 12 to 24 volts standardly available in motor vehicles, the collecting electrodes should have the least possible distance D between them. In light of the fact that the resistance R of the heatable coating increases with the length of the current path and since the motor vehicle panes are usually wider than they are high, the collecting electrodes are normally arranged along the upper and lower pane edge such that the heating current can flow via the shorter path of the height of the window pane.

But, panes with an electrical heating layer block electromagnetic radiation relatively strongly such that, in particular in motor vehicles with a heatable windshield, radio data traffic can be significantly compromised. Heatable windshields are, consequently, frequently provided with coating-free zones ("communication windows or sensor windows"), which are quite permeable at least to certain ranges of the electromagnetic spectrum, to thus enable trouble-free data traffic. The coating-free zones, on which electronic devices, such as sensors and the like, are frequently situated, are commonly arranged in the vicinity of the upper edge of the pane, where they can be well concealed by the upper masking strip.

However, coating-free zones compromise the electrical properties of the heating layer, affecting, at least locally, the current density distribution of the heating current flowing through the heating layer. Actually, they cause a highly inhomogeneous heating output distribution, with the heating output clearly reduced below and in the area surrounding the coating-free zones. On the other hand, sites with a particularly high current density ("hot spots") appear, in which the heating output is highly increased. As a result, very high local pane temperatures can appear, which present a danger of burns and impose great thermal stresses on the panes. In addition, adhesion points of parts mounted thereon can be loosened thereby.

Experts have attempted to remedy this problem by the shaping of the heating field and/or the collecting lines and/or the installation of a third collecting line.

Thus, for example, a heatable windshield is known from the British patent application GB 2381179 A, whose heating layer is divided into at least two fields or zones that are separated from one another by uncoated regions. The coating-free communication window is situated in the central zone of the coating. The upper bus bar in the installed state is guided around three edges (horizontal lower edge and the two vertical side edges running parallel to one another) of the communication window. The subsections of the busbar running along the two side edges are guided through the two uncoated regions that separate the central zone from the two zones positioned laterally thereto.

From the international patent application WO 2011/006743 A1, a heatable windshield is known that has, on a transparent substrate, an electrically conductive coating, two electrical collecting bands, at least one locally limited region demarcated by the coating and, within this region, a coating-free region as a communication window. The demarcated region is at least partially bounded by at least two current collecting regions on the coating running parallel to the equipotential lines and connected via at least one ohmic resistor and at least two electrically isolating separation lines running parallel to electrical field lines.

From the European patent application EP 2 334 141 A1, a coated pane with a heatable communication window is likewise known. At least one heating conductor with two poles is applied in the coating-free region of the communication window, with the first pole electrically connected to the electrically conductive transparent coating and the second pole electrically connected to said coating or to a current collecting band.

Also known from the international patent applications WO 2012/031907 A1 and WO 2012/031908 A1 is a transparent pane with an electrically heatable coating that is electrically connected to at least two first electrodes provided for the electrical connections to the two terminals of a voltage source such that, by applying a supply voltage, a heating current flows via a heating field formed between the two first electrodes. Here, the heating field has at least one coating-free zone as a communication window that is bordered by a zone edge formed at least in sections by the heatable coating. The pane further has a second electrode that is provided for connecting to one terminal of the voltage source. This second electrode has at least one supply section arranged at least in sections in the coating-free zone and one or a plurality of connection sections connected to the supply section. Here, the connection sections extend in each case starting from the coating-free zone beyond an edge section. The edge section is formed by a section of the heating field that is situated between the coating-free zone and the first electrode provided for connecting to the other terminal of the voltage source.

In one embodiment, the supply section consists of at least two supply parts separated from one another that have, in each case, a coupling adapter that is electrically connected to the heatable coating. Here, the two coupling sections are arranged such that they are galvanically coupled by the heatable coating.

These known configurations of heatable panes have already brought significant progress. However, the known configurations cannot satisfactorily solve the above-described problems of local overheating in heatable panes that have a particularly large communication window and/or a particularly demanding geometric design of the black edge coating.

In contrast, the object of the present invention consists in improving the known generic panes such that the panes are heatable with an at least virtually uniform heating output distribution and no longer have hotspots caused by new, particularly demanding geometric designs of the black edge coating and/or by particularly large communication windows.

These and other objects are accomplished according to the proposal of the invention by a transparent pane with the characteristics of the independent claim. Advantageous embodiments of the invention are indicated by the characteristics of the subclaims.

In an advantageous embodiment of the pane according to the invention, the surface of the first pane, on which the electrically heatable coating is arranged, is areally bonded to a second pane via a thermoplastic intermediate layer.

In principle, all electrically insulating substrates that are thermally and chemically stable as well as dimensionally stable under the conditions of the production and the use of the pane according to the invention are suitable as the first and, optionally, the second pane.

The first pane and/or the second pane preferably contain glass, particularly preferably flat glass, float glass, quartz glass, borosilicate glass, soda lime glass, or clear plastics, preferably rigid clear plastics, in particular, polyethylene, polypropylene, polycarbonate, polymethyl methacrylate, polystyrene, polyamide, polyester, polyvinyl chloride, and/or mixtures thereof. The first pane and/or the second pane are preferably transparent, in particular, for the use of the pane as a windshield or rear window of a motor vehicle or other uses wherein high light transmittance is desired. In the context of the invention, the term "transparent" is then understood to mean a pane that has transmittance in the visible spectral range of >70%. For panes, which are not in the traffic-relevant field of vision of the driver, for example, for roof panes, the transmittance can, however, also be much less, for example, >5%.

The thickness of the pane according to the invention can vary widely and thus be imminently adapted to the requirements of the individual case. Preferably used are panes with the standard thicknesses of 1.0 mm to 25 mm, preferably of 1.4 mm to 2.5 mm for motor vehicle glass, and preferably from 4 mm to 25 mm for furniture, devices, and buildings, in particular, for electric heaters. The size of the pane can vary widely and is governed by the size of the use according to the invention. The first pane and, optionally, the second pane have, for example, in the automotive industry and in the architectural field, customary areas of 200 cm$^2$ to as much as 20 m$^2$.

The pane according to the invention can have any three-dimensional shape. Preferably, the three-dimensional shape has no shadow zones such that it can, for example, be coated by cathodic sputtering. Preferably, the substrates are planar or slightly or greatly curved in one direction or in multiple spatial directions. In particular, planar substrates are used. The panes can be colorless or colored.

Multiple panes are bonded to one another by at least one intermediate layer. The intermediate layer contains, preferably, at least one thermoplastic plastic, preferably polyvinyl butyral (PVB), ethylene vinyl acetate (EVA), and/or polyethylene terephthalate (PET). However, the thermoplastic intermediate layer can, for example, also contain polyurethane (PU), polypropylene (PP), polyacrylate, polyethylene (PE), polycarbonate (PC), polymethyl methacrylate, polyvinyl chloride, polyacetate resin, casting resins, fluorinated ethylene-propylene copolymerizates, polyvinyl fluoride, and/or ethylene-tetrafluoroethylene copolymerizates, or copolymers or mixtures thereof. The thermoplastic intermediate layer can be formed by one or even by multiple thermoplastic films arranged one over another, with the thickness of a thermoplastic film preferably being from 0.25 mm to 1 mm, typically 0.38 mm or 0.76 mm.

In the case of a composite pane according to the invention comprising a first pane, an intermediate layer, and a second pane, the electrically heatable coating can be applied directly to the first pane or to a carrier film or applied to the intermediate layer itself. The first pane and the second pane have, in each case, an inner surface and an outer surface. The inner surfaces of the first and the second pane face one another and are bonded to one another via the thermoplastic intermediate layer. The outer surfaces of the first and the second pane face away from one another and away from the thermoplastic intermediate layer. The electrically conductive coating is applied to the inner surface of the first pane. Of course, another electrically conductive coating can also be applied to the inner surface of the second pane. The outer surfaces of the panes can also have coatings. The expressions "first pane" and "second pane" are selected to distinguish between the two panes in a composite pane according to the invention. No statement as to the geometric arrangement is associated with the expressions. If the pane according to the invention is intended, for example, in an opening of a motor vehicle or a building, to separate the interior space from the external environment, the first pane can face the interior space or the external environment.

The transparent pane according to the invention comprises an electrically conductive, heatable, transparent coating that extends over at least a substantial part of the area of the pane, in particular, over its field of vision. The electrically conductive coating is electrically connected to at least two, in particular, two, collecting electrodes provided for electrical connection to the two terminals of a voltage source such that, by applying a supply voltage, a heating current flows over a heating field formed between the two collecting electrodes. Typically, the two collecting electrodes are, in each case, implemented in the form of a strip-shaped or band-shaped electrode or collecting rail or busbar for the introduction and broad distribution of the current in the conductive coating. For this purpose, they are galvanically connected to the heating layer.

Preferably, at least one, in particular, one, of the two collecting electrodes, preferably the upper collecting electrode in the installed state of the transparent pane, is subdivided into at least two, in particular, two, subregions separated from one another.

In an advantageous embodiment, the collecting electrode is implemented as a printed and fired conductive structure. The printed collecting electrode preferably contains at least a metal, a metal alloy, a metal compound, and/or carbon, particularly preferably a noble metal, and, in particular, silver. The printing paste for producing the collecting electrode preferably contains metallic particles, metal particles, and/or carbon, and, in particular, noble metal particles such as silver particles. The electrical conductivity is preferably obtained by means of the electrically conductive particles. These particles can be situated in an organic and/or inorganic matrix such as pastes or inks, preferably as a printing paste with glass frits.

The layer thickness of the printed collecting electrode is preferably from 5 μm to 40 μm, particularly preferably from 8 μm to 20 μm, and most particularly preferably from 8 μm to 12 μm. Printed collecting electrodes with these thicknesses are technically simple to realize and have an advantageous current carrying capacity.

The specific resistance $P_a$ of the collecting electrode is preferably from 0.8 μohm·cm to 7.0 μohm·cm and particularly preferably from 1.0 μohm cm to 2.5 μohm cm. Collecting electrodes with specific resistances in this range are technically simple to realize and have an advantageous current carrying capacity.

However, alternatively, the collecting electrode can also be implemented as a strip, or, in the case of the collecting electrode subdivided into subregions, as at least two, in particular, two, strips of an electrically conductive film. The collecting electrode then contains, for example, at least aluminum, copper, tinned copper, gold, silver, zinc, tungsten, and/or tin or alloys thereof. The strip preferably has a thickness from 10 μm to 500 μm, particularly preferably from 30 μm to 300 μm. Collecting electrodes made of electrically conductive films with these thicknesses are technically simple to realize and have an advantageous current carrying capacity. The strip can be electrically conductively connected to the electrically conductive structure, for example, via a solder compound, via an electrically conductive adhesive, or by direct placement.

The electrically conductive coating of the pane according to the invention can be subdivided into a heating field, i.e., the heatable part of the electrically conductive coating, which is situated between the two collecting electrodes such that a heating current can be introduced, and a region outside said heating field.

Electrically heatable coatings are known, for example, from DE 20 2008 017 611 U1, EP 0 847 965 B1, or WO2012/052315 A1. They typically include a functional layer or multiple, for example, two, three, or four electrically conductive functional layers. The functional layers preferably contain at least a metal, for example, silver, gold, copper, nickel and/or chromium, or a metal alloy. The functional layers particularly preferably contain at least 90 wt.-% of the metal, in particular, at least 99.9 wt.-% of the metal. The functional layers can be made of the metal or the metal alloy. The functional layers particularly preferably contain silver or a silver-containing alloy. Such functional layers have a particularly advantageous electrical conductivity with, at the same time, high transmittance in the visible spectral range. The thickness of the functional layer is preferably from 5 nm to 50 nm, particularly preferably from 8 nm to 25 nm. In this range for the thickness of the functional layer, advantageously high transmittance in the spectral range and particularly advantageous electrical conductivity are obtained.

Typically, at least one dielectric layer is arranged, in each case, between two adjacent functional layers of the electrically conductive coating. Preferably, another dielectric layer is arranged below the first and/or above the last functional layer. A dielectric layer contains at least one individual layer made of a dielectric material, for example, a nitride such as silicon nitride or an oxide such as aluminum oxide. The dielectric layer can, however, also include multiple individual layers, for example, individual layers of a dielectric material, smoothing layers, matching layers, blocker layers, and/or anti-reflection layers. The thickness of a dielectric layer is, for example, from 10 nm to 200 nm.

This layer structure is generally obtained through a sequence of deposition procedures that are performed using a vacuum method such as magnetically enhanced cathodic sputtering.

Other suitable electrically conductive coatings preferably contain indium tin oxide (ITO), fluorine-doped tin oxide ($SnO_2$:F), or aluminum-doped zinc oxide (ZnO:Al).

The electrically conductive coating can, in principle, be any coating that is to be electrically contacted. If the pane according to the invention is intended to enable vision through it, as is the case, for example, with panes in the window area, the electrically conductive coating is preferably transparent. The electrically conductive coating is, preferably, transparent to electromagnetic radiation, particularly preferably to electromagnetic radiation of a wavelength of 300 to 1300 nm, and, in particular, to visible light.

In an advantageous embodiment, the electrically conductive coating is a layer or a layer structure of a plurality of individual layers with a total thickness less than or equal to 2 μm, particularly preferably less than or equal to 1 μm.

An advantageous electrically conductive coating has a sheet resistance from 0.4Ω/□ to 10Ω/□. In a particularly preferred embodiment, the electrically conductive coating according to the invention has a sheet resistance from 0.5Ω/□ to 1Ω/□. Coatings with such sheet resistances are particularly well-suited for the heating of motor vehicle window panes with typical onboard voltages from 12 V to 48 volts or in electric motor vehicles with typical onboard voltages of as much as 500 V.

The electrically conductive layer can extend over the entire surface of the first pane. Alternatively, however, the electrically conductive layer can also extend over only part of the surface of the first pane. The electrically conductive layer preferably extends over at least 50%, particularly preferably over at least 70%, and most particularly preferably over at least 90% of the inner surface of the first pane.

In an advantageous embodiment of a transparent pane according to the invention as a composite pane, the inner surface of the first pane has a circumferential edge region with a width from 2 mm to 50 mm, preferably from 5 mm to 20 mm, that is not provided with the electrically conductive coating. Then, the electrically conductive coating has no contact with the atmosphere and is, in the interior of the pane, protected by the thermoplastic intermediate layer against damage and corrosion.

In the transparent pane according to the invention, the heating field includes at least one coating-free zone in which no electrically conductive coating is present. The coating-free zone is bounded by a zone edge formed at least in sections by the electrically conductive coating.

In particular, the coating-free zone has a circumferential zone edge that is completely formed by the electrically conductive coating.

However, the zone edge can transition into the circumferential coating edge of the electrically conductive coating such that the coating-free zone is connected directly to the coating-free edge strip of the transparent pane according to the invention surrounding the pane edge.

The coating-free zone can have quite varied contours. Thus, the contour can be square, rectangular, trapezoidal, triangular, pentagonal, hexagonal, heptagonal, or octagonal with rounded corners and/or curved edges as well as being circular, oval, drop-shaped, or elliptical. The contour lines can have a straight line, wavy, zigzag, and/or a saw-tooth course. A plurality of these geometric characteristics can be implemented in one and the same coating-free zone.

In particular, the coating-free zone serves as a communication window that is permeable to electromagnetic radiation, in particular, IR radiation, radar radiation, and/or radio radiation. In addition, sensors, for example, rain sensors, can also be placed in the communication window.

The coating-free zone can be produced, for example, by masking at the time of application of the heating layer onto a substrate or by removal of the heating layer, for example, by mechanical or chemical ablation and/or by ablation by means of irradiation with electromagnetic radiation, in particular, laser light radiation, after application of the electrically heatable coating.

In a preferred embodiment, at least one, in particular, one coating-free zone is present.

Preferably, this at least one second coating-free zone is arranged, in the installed state of the transparent pane according to the invention, above the at least one first coating-free zone.

Preferably, the at least one second coating-free zone has the contours and contour lines described above.

Preferably, the at least one second coating-free zone has a smaller area than the at least one first coating-free zone.

It is a particular advantage of the transparent pane according to the invention that
- at least one, in particular, one, first coating-free zone and at least one, in particular, one, second coating-free zone,
- at least one, in particular, one, first coating-free zone and at least one zone of the edge strip,
- at least eine, in particular, one, second coating-free zone and at least one zone of the edge strip or
- at least one, in particular, one, first coating-free zone, at least one, in particular, one, second coating-free zone and at least one zone of the edge strip can form at least one, in particular, one, uniform coating-free zone.

Preferably, the at least one coating-free zone is arranged, in the installed state of the transparent pane, in its upper region.

According to the proposal of the invention, the transparent pane according to the invention is substantially distinguished in that it has at least one, in particular one additional electrode or third busbar provided for electrical connection to one terminal of the voltage source that is arranged, at least in sections, in particular, only with one electrode section, in the coating-free zone or preferably in and/or on the heating field of the electrically heatable coating and is electrically connected to the electrically conductive coating such that through application of a feed voltage, a part of the heating current flows via a heating field section of the heating field that is situated between the additional electrode or the coating-free zone and the collecting electrode provided for connection to the other terminal of the voltage source.

At least one of the additional electrodes or the one additional electrode can be subdivided into at least two, in particular, two, subregions separated from one another.

Preferably, the at least one additional electrode extends or the at least two subregions of the additional electrode separated from one another extend along the lower zone edge of the at least one coating-free zone, in the installed state of the transparent pane according to the invention. "Along" means that the additional electrode or its subregions separated from one another run nearly parallel or exactly parallel to the lower zone edge.

If the additional electrode or its at least two subregions separated from one another is arranged in the coating-free zone such that the area between the zone edge of the heating field and the additional electrode or its subregions is still coating-free, the electrical connection of the additional electrode to the heating field section is accomplished using at least two, preferably at least three, more preferably at least four, and, in particular, at least five connection sections. If the additional electrode is subdivided into at least two, in particular two, subregions separated from one another, at least one subregion has or, in particular, all subregions have at least two, preferably at least three, more preferably at least four, and, in particular, at least five connection sections.

The connection sections can have the form of straight or curved strips whose length is greater than their width.

However, the connection sections can also be formed by bulges and/or protrusions of the additional electrode or its subregions if it/they, for example, runs/run in the shape of a wave, a zigzag, saw teeth, or a meander such that they touch the heating field in sections.

The connection sections extend from the additional electrode or its subregions separated from one another into the heating field section of the heating field between the additional electrode or its subregions and the electrically charged collecting electrode opposite thereto, in particular, the lower collecting electrode in the installed state of the transparent pane according to the invention.

Preferably, the electrical connection of the additional electrode or the at least two subregions of the additional electrode separated from one another to one terminal of the voltage source is made via one of the two collecting electrodes, in particular, via the upper collecting electrode in the installed state of the pane according to the invention.

In a preferred embodiment of the transparent pane, at least two, in particular, two, electrical supply lines lead from at least one, in particular, one, of the two collecting electrodes to the at least one, in particular, one, additional electrode.

In another preferred embodiment of the transparent pane, at least one, in particular, one, electrical supply line leads, in each case, from at least one, in particular, one, of the two collecting electrodes to each of the at least two, in particular, two, subregions of the additional electrode.

In yet another preferred embodiment of the transparent pane, at least one, in particular, one, electrical supply line leads, in each case, from each of the at least two, in particular, two, subregions of the collecting electrode to the at least one, in particular, one, additional electrode.

In yet another preferred embodiment of the transparent pane, at least one, in particular, one, electrical supply line leads, in each case, from each of the at least two, in particular, two, subregions of the collecting electrode to each of the at least two, in particular, two, subregions of the additional electrode.

In yet another preferred embodiment of the transparent pane, a coupling line leads from at least one collecting electrode or from at least one subregion of at least one collecting electrode to the ends of two electrical supply lines associated with the additional electrode. In other words, the coupling line branches at a node into two electrical supply lines, which lead to the ends of the additional electrode or, in each case, to one end of two subregions of the additional electrode.

In yet another preferred embodiment of the transparent pane, the electrical connection is produced between at least one collecting electrode or at least one subregion of at least one collecting electrode and at least one additional electrode or at least two subregions of an additional electrode by galvanic coupling via a coupling field of the heating field arranged between the relevant collecting electrode or the relevant subregion of at least one collecting electrode on the one hand and at least one, in particular, one, coupling electrode on the other. The coupling electrode connects, in each case, one end of two electrical supply lines that lead to the ends of an additional electrode or even, in each case, to one end of a subregion of an additional electrode. Thus, with this configuration, the associated first coating-free zone is surrounded by a circumferential electrical conductor path comprising a coupling electrode, two electrical supply lines, and one additional electrode or at least two subregions of an additional electrode.

In the above described preferred embodiments, the galvanic connection or coupling between the subregions of the additional electrode is made via the heating field section of the heating field between the additional electrode or its subregions and the opposing electrically charged collecting electrode, in particular, the lower collecting electrode in the installed state of the transparent pane according to the invention.

According to the invention, at least one electrical supply line is and, in particular, all electrical supply lines are arranged at least in sections
  in the heating field and/or
  in at least one subregion of the electrically conductive coating outside the heating field, i.e., the region of the electrically conductive coating that is arranged between the collecting electrode or its subregions and the pane edge, and/or
  in at least one zone of the edge strip in the region of the electrically conductive coating outside the heating field, and/or
  at and/or in the zone edge of the at least one, in particular, one, second, coating-free zone, formed by the electrically conductive coating, and/or
  in at least one, in particular, one of the at least one first coating-free zone or the edge strip associated with the at least one, in particular, one, second coating-free zone, and/or
  in the at least one, in particular, one, first coating-free zone, and/or
  in and/or on at least one lateral zone edge zonenrand, in particular, two lateral zone edges, of the at least one, in particular, one, first coating-free zone.

In a preferred embodiment, the at least two, in particular, two, electrical supply lines run in sections
  in at least two, in particular, two, subregions of the electrically conductive coating outside the heating field, i.e., outside the region of the electrically conductive coating that is arranged between the collecting electrode or its subregions and the pane edge, and/or
  in at least two, in particular, two, zones of the edge strip in the region of the electrically conductive coating outside the heating field,
  inside the zone edge of the at least one, in particular, one, second, coating-free zone formed by the electrically conductive coating, and in the heating field along two lateral zone edges of the at least one, in particular, one, first coating-free zone.

The length of the electrical supply lines can vary broadly and, consequently, be eminently adapted to the requirements of the individual case.

Likewise, the width of the electrical supply lines can vary broadly and also be eminently adapted to the requirements of the individual case.

The electrical supply lines can run in sections in a straight line, in a curve, in a wave shape, in a zigzag shape, in a sawtooth shape, and/or in a meander.

Preferably, the length and the width as well as the shape, in particular the length and the width, of the electrical supply lines, is selected in the individual case such that the additional electrode or its subregions has/have a voltage such that a temperature is established in the regions of the heating field and the heating field section adjacent them and the coating-free zone that deviates only slightly, preferably only 5 to 50° C., in particular only 5 to 40° C., and, ideally, not at all, from the temperature of the rest of heated coating.

More precisely stated, on the one hand, by means of the length of the additional electrode or its subregions, the electrical potential, in particular, at the connection point to the heating field is established such that the most possible current flows via the additional electrode or its subregions. On the other hand, only so much current can be allowed to flow that the additional electrode or its subregions and their direct surroundings do not overheat, in order to prevent the formation of hotspots. Thus, theoretically, the electrical potential or the electrical resistance of the additional electrode could accordingly be adapted only by its width. However, in this case, the problem would arise that the entire voltage drop would have to be relieved over only a very short additional electrode, which itself would lead to overheating of the additional electrode or its subregions. This problem can, however, be solved by means of the longest possible electrical supply lines, which prevent overheating.

Preferably, the electrical supply lines are made of the same electrically conductive materials as the collecting electrodes.

According to the invention, the formation of hotspots is even more effectively prevented due to the fact that at least one coating-free line runs and in particular, at least two, in particular, two, coating-free lines run in the heating field at least in sections along at least one electrical supply line and in particular, along at least two, in particular, two, electrical supply lines.

Here, the coating-free lines always run on the side of the electrical supply lines facing away from the coating-free zone.

According to the invention, the coating-free lines run, at least in sections, continuously and/or as broken lines with discrete breaks. Preferably, they run continuously, i.e., without breaks, over their entire length.

In a preferred embodiment, the coating-free lines run out from one collecting electrode through the heating field all the way to the level of the additional electrode or all the way to the level of the subregions of the additional electrode.

In another preferred embodiment, the coating-free lines run out from a collecting electrode through the heating field all the way to the level of the additional electrode or to the level of the subregions of the additional electrode and from there out in sections through the heating field section along the additional electrode or longest subregions of the additional electrode.

In yet another preferred embodiment, the coating-free lines begin in the heating field at a certain distance from the collecting electrode.

Preferably, the coating-free lines run at least in sections in straight lines, in the shape of a wave, a saw, a meander, and/or a zigzag. Preferably, they run, in each case, in their entire length in a straight line along the electrical supply lines associated therewith.

The length of the coating-free lines can vary broadly and, consequently, be advantageously adapted to the requirements of the individual case. In particular, their length is governed by the length of the sections of the electrical supply lines associated therewith in the heating field.

The width of the coating-free lines is very much less than their length and can vary during its course. Preferably, the width is constant over the entire course. Preferably, the width is in the range from 10 µm to 1 mm.

Overall, a virtually homogeneous distribution of the heating power is effected by the arrangement according to the invention of collecting electrode, additional electrode, electrical supply lines, and coating-free lines; and the formation of spots with reduced or elevated heating power (hotspots) is effectively prevented.

Thus, the formation of residues of ice and/or condensed water can also be effectively prevented by means of the arrangement according to the invention in the region of the coating-free zone of the transparent pane according to the invention.

The collecting electrodes and/or their subregions are electrically contacted by one or a plurality of feed lines.

The feed line is preferably implemented as a flexible foil conductor or flat conductor or ribbon cable. This is understood to mean an electrical conductor whose width is clearly greater than its thickness. Such a flat conductor is, for example, a strip or tape, containing or made of copper, tinned copper, aluminum, silver, gold, or alloys thereof. The flat conductor has, for example, a width of 2 mm to 16 mm and a thickness of 0.03 mm to 0.1 mm. The flat conductor can have an insulating, preferably polymeric sheath, based, for example, on polyimide. Flat conductors that are suitable for the contacting of electrically conductive coatings in panes have a total thickness of, for example, only 0.3 mm. Such thin flat conductors can be embedded without difficulty in the thermoplastic intermediate layer between the individual panes. A plurality of conductive layers isolated from one another can be situated in a ribbon cable.

Alternatively, thin metal wires can also be used as electrical feed lines. The metal wires contain, in particular, copper, tungsten, gold, silver, or aluminum or alloys of at least two of these metals. The alloys can also contain molybdenum, rhenium, osmium, iridium, palladium, or platinum.

In a preferred embodiment of the transparent pane according to the invention, each of the at least two, in particular, two, collecting electrodes is electrically conductively connected in each case by a flat conductor to the terminals of the voltage source.

In another preferred embodiment, the at least two, in particular, two, subregions of the at least one, in particular, one, collecting electrode are electrically conductively connected by, in each case, a flat conductor connected to a voltage source. Preferably, the flat conductors are arranged in the region of the subregions that is near the respective associated second side of the pane edge. In this embodiment, the electrical isolation of the flat conductor from the electrical supply lines is accomplished by the spatial separation of the components.

In yet another preferred embodiment, the at least two, in particular, two, subregions of the at least one, in particular, one collecting electrode are electrically conductively connected to a flat conductor. Preferably, in this embodiment, the flat conductor is arranged centrally between the two opposing ends of the subregions. Preferably, this is implemented by a common electrically conductive connecting part or by two electrically conductive connection parts associated with the respective subregion. The flat conductor can be connected to the electrically conductive connecting part by a flat metal strip, in particular, a copper strip.

Here, the flat conductor and the at least one connecting part as well as, optionally, the flat metal strip, are, in particular, copper strips, arranged electrically isolated from the at least two electrical supply lines.

In this case, the electrical isolation between the flat conductor and the connecting part on the one hand and the at least two electrical supply lines on the other is implemented by means of an electrically insulating layer, in particular, by means of a strip-shaped, electrically insulating layer, between the flat conductor and the connecting part on the one hand and the at least two electrical supply lines on the other. The electrically insulating layer, in particular, the strip-shaped, electrically insulating layer, covers at least the points of intersection of the connecting part with the at least two electrical supply lines. However, it can also abut the two opposing end edges of the subregions.

Preferably, this arrangement has, overall, a layered structure composed of the following superimposed layers:

a pane, sections of the electrical supply lines covered by the insulation, the subregions of the coating adjacent the electrical supply lines electrical supply lines outside the heating field, on whose zone edges the opposing edges of the electrically insulating layer abut; at the same time, these edges can abut the opposing end edges of the two subregions of the collecting electrode, a flat conductor resting on the electrically insulating layer, subregions of the collecting electrode, as well as the connecting part electrically connected thereto.

A substantial advantage of this arrangement is that now only one flat conductor is required for supplying two subregions of one collecting electrode, which substantially simplifies the production of the transparent pane according to the invention.

In a preferred embodiment of the transparent pane according to the invention, the regions in which the collecting electrodes, the flat conductor(s), the additional electrode(s), the electrical supply lines as well as the coating-free zones are arranged are partially or completely optically masked by conventional and known opaque or nontransparent masking strips. Preferably, the masking strips are colored black. Preferably, the precursors of the masking strips are applied by screen printing on the as yet uncoated panes, after which the applied layers are fired.

The panes according to the invention can be produced in a conventional and known manner. Preferably, they are produced using the method according to the invention.

The method according to the invention comprises the following process steps:

(A) Producing an electrically conductive coating (B) Producing at least one coating-free zone or at least two, in particular, two, coating-free zones in the electrically conductive coating and in the heating field;

(C) Forming (c1) at least two, in particular, two, collecting electrodes connected to the two terminals of a voltage source, which are electrically connected to the electrically conductive coating such that by applying a supply voltage, a heating current flows via a heating field situated between the two collecting electrodes, and/or (c2) at least two collecting electrodes connected to the two terminals of a voltage source, which are electrically connected to the electrically conductive coating, wherein at least one of the two collecting electrodes is implemented subdivided into at least two subregions separated from one another;

(D) Producing (d1) at least one additional electrode provided for electrically connecting to at least on of the two collecting electrodes and/or (d2) at least two, in particular, two, subregions of the additional electrode provided for electrically connecting to at least one of the two, in particular, both, collecting electrodes and/or (d3) at least one, in particular, one, additional electrode provided for electrically connecting to at least two subregions another and/or (d4) at least two, in particular, two, subregions of the additional electrode provided for electrically connecting to, in each case, at least one, in particular, one, of the at least two, in particular, two, subregions separated from one another;

(E) Producing at least two, in particular, two, electrical supply lines for the at least one, in particular, one, additional electrode or its at least two, in particular, two subregions, (e1) which are guided from at least one, in particular, one, of the two collecting electrodes to the at least one, in particular, one, additional electrode, (e2) of which, in each case, at least one, in particular, one, of each of the at least two subregions is guided to the at least one, in particular, one, additional electrode, (e3) of which, in each case, at least one, in particular, one, of at least one, in particular, one, of the two collecting electrodes is guided to each of the at least two, in particular, two, subregions of the additional electrode, and/or (e4) of which, in each case, at least one in particular, one, of each of the at least two in particular, two, subregions is guided to each of the at least two, in particular, two, subregions of the additional electrode, (e5) both are connected to a coupling line, which is guided to at least one, in particular, one, of the two collecting electrodes or to at least one of the at least two subregions of at least one collecting electrode, or (e6) both are connected to a coupling electrode that is electrically connected (i.e., galvanically coupled) via a coupling field situated in the heating field between the coupling electrode on the one hand and at least one collecting electrode or at least one of the at least two subregions of at least one collecting electrode on the other to the at least one collecting electrode or at least one of the at least two subregions of at least one collecting electrode, and (F) Producing at least one coating-free line and, in particular, two, coating-free lines in the heating field along the side, facing away from the coating-free zone, of at least one section of at least one electrical supply line and, in particular, two electrical supply lines before, during, or after process step (B), wherein (G) the process steps (C), (D), and (E) are performed in succession or simultaneously.

In a preferred embodiment of the method according to the invention, in process step (E) at least one electrical supply line and, in particular, at least two, in particular, two, electrical supply lines (16, 16') is/are produced running at least in sections in at least one subregion and in particular, in at least two subregions of the electrically conductive coating outside the heating field, and/or in at least one zone and in particular, in at least two, in particular, two, zones of the edge strip in the region of the zone of the coating edge, and/or below at least one, in particular, one, electrically insulating layer, on which a flat conductor and at least one, in particular, one, common connecting part and/or at least two, in particular, two, connecting parts are arranged between the flat conductor and the at least two, in particular, two, subregions, and/or at and/or in the zone edge of at least one, in particular, one, second coating-free zone formed by the electrically conductive coating, and/or in the heating field, and/or in the at least one, in particular, one, first coating-free zone, and/or in and/or at at least one lateral zone edge and in particular, at at least two, in particular, two, lateral zone edges of the at least one, in particular, one, first coating-free zone.

In a particularly preferred embodiment of the method according to the invention, the process steps (C), (D), and (E) are performed simultaneously. Preferably, a screen printing method is used here.

Particularly preferably, the coating-free lines (21, 21') are produced in process step (F) by laser ablation of the electrically conductive coating (8) of the heating field (12).

Specifically, the application of the electrically conductive coating in process step (A) can be done by methods known per se, preferably by magnetic-field enhanced cathodic sputtering. This is particularly advantageous with regard to simple, quick, economical, and uniform coating of the first pane, when the pane according to the invention is designed as a composite pane. However, the electrically conductive, heatable coating can also be applied, for example, by vapor deposition, chemical vapor deposition (CVD), plasma enhanced chemical vapor (PECVD), or by wet chemical methods.

The first pane can be subjected, after process step (A), to a temperature treatment. Here, the first pane with the electrically conductive coating is heated to a temperature of at least 200° C., preferably at least 300° C. The temperature treatment can serve to increase transmittance and/or to reduce the sheet resistance of the electrically conductive coating.

The first pane can be bent after process step (A), typically at a temperature from 500° C. to 700° C. Since it is technically simpler to coat a flat pane, this procedure is advantageous if the first pane is to be bent. However, alternatively, the first pane can also be bent before process step (A), for example, if the electrically conductive coating is unsuitable to withstand a bending process without damage.

The application of the collecting electrodes in process step (C) and the electrical supply lines in process step (E) is preferably done by printing and firing an electrically conductive paste in a screen print method or in an inkjet method. Alternatively, the collecting electrodes and the electrical supply lines can be applied as strips of an electrically conductive foil on the electrically conductive coating, preferably placed, soldered, or glued.

In screen printing methods, the lateral shaping is done by masking the mesh through which the printing paste with the metal particles is pressed. By means of suitable shaping of the masking, it is possible, for example, in a particularly simple manner, to predefine and vary the width of the collecting electrode.

The coating-free zones are produced in process step (B), preferably by mechanical ablation of the heatable coating produced in process step (A). The mechanical ablation can also be replaced or supplemented by treatment with suitable chemicals and/or by irradiation with electromagnetic radiation.

An advantageous improvement of the method according to the invention includes at least the following additional steps:

Arranging a thermoplastic intermediate layer on the coated surface of the first pane and arranging a second pane on the thermoplastic intermediate layer, and Bonding the first pane and the second pane via the thermoplastic intermediate layer.

In these process steps, the first pane is arranged such that the one of its surfaces that is provided with the heatable coating faces the thermoplastic intermediate layer. The surface thus becomes the inner surface of the first pane.

The thermoplastic intermediate layer can be formed by a single thermoplastic film or by two or more thermoplastic films arranged areally one over another.

The bonding of the first and second pane is preferably done under the action of heat, vacuum, and/or pressure. Methods known per se for producing a pane can also be used.

For example, so-called "autoclave methods" can be performed at an elevated pressure of roughly 10 bar to 15 bar and temperatures from 130° C. to 145° C. for roughly 2 hours.

Vacuum bag or vacuum ring methods known per se operate, for example, at roughly 200 mbar and 80° C. to 110° C. The first pane, the thermoplastic intermediate layer, and the second pane can also be pressed in a calender between at least one pair of rollers to form a pane. Systems of this type for producing panes are known and normally have at least one heating tunnel upstream from a pressing unit. The temperature during the pressing operation is, for example, from 40° C. to 150° C. Combinations of calender and autoclave methods have proved particularly valuable in practice. Alternatively, vacuum laminators can be used. These consist of one or a plurality of heatable and evacuable chambers, in which the first pane and the second pane are laminated within, for example, roughly 60 minutes at reduced pressures from 0.01 mbar to 800 mbar and temperatures from 80° C. to 170° C.

The transparent pane according to the invention, in particular the transparent pane according to the invention produced using the method according to the invention, can be ideally used as a functional and/or decorative individual piece and/or as a built-in component in furniture, devices, and buildings as well as in means of transportation for transportation on land, in the air, or on water, in particular, in motor vehicles, for example, as a windshield, rear window, side window, and/or glass roof. Preferably, the transparent pane according to the invention is implemented as a vehicle windshield or vehicle side window.

It is understood that the characteristics mentioned above and explained in detail in the following can be used not only in the combinations and configurations indicated, but also in other combinations and configurations or alone without departing from the scope of the present invention.

BRIEF DESCRIPTION OF THE FIGURES

The invention is now explained in detail using exemplary embodiments with reference to the accompanying figures. They depict, in simplified, not to scale representation:

FIG. 10 a plan view of yet another exemplary embodiment of the windshield according to the invention in simplified representation;

FIG. 11 a plan view of yet another exemplary embodiment of the windshield according to the invention in simplified representation;

FIG. 12 a plan view of yet another exemplary embodiment of the windshield according to the invention in simplified representation.

Figure 1:
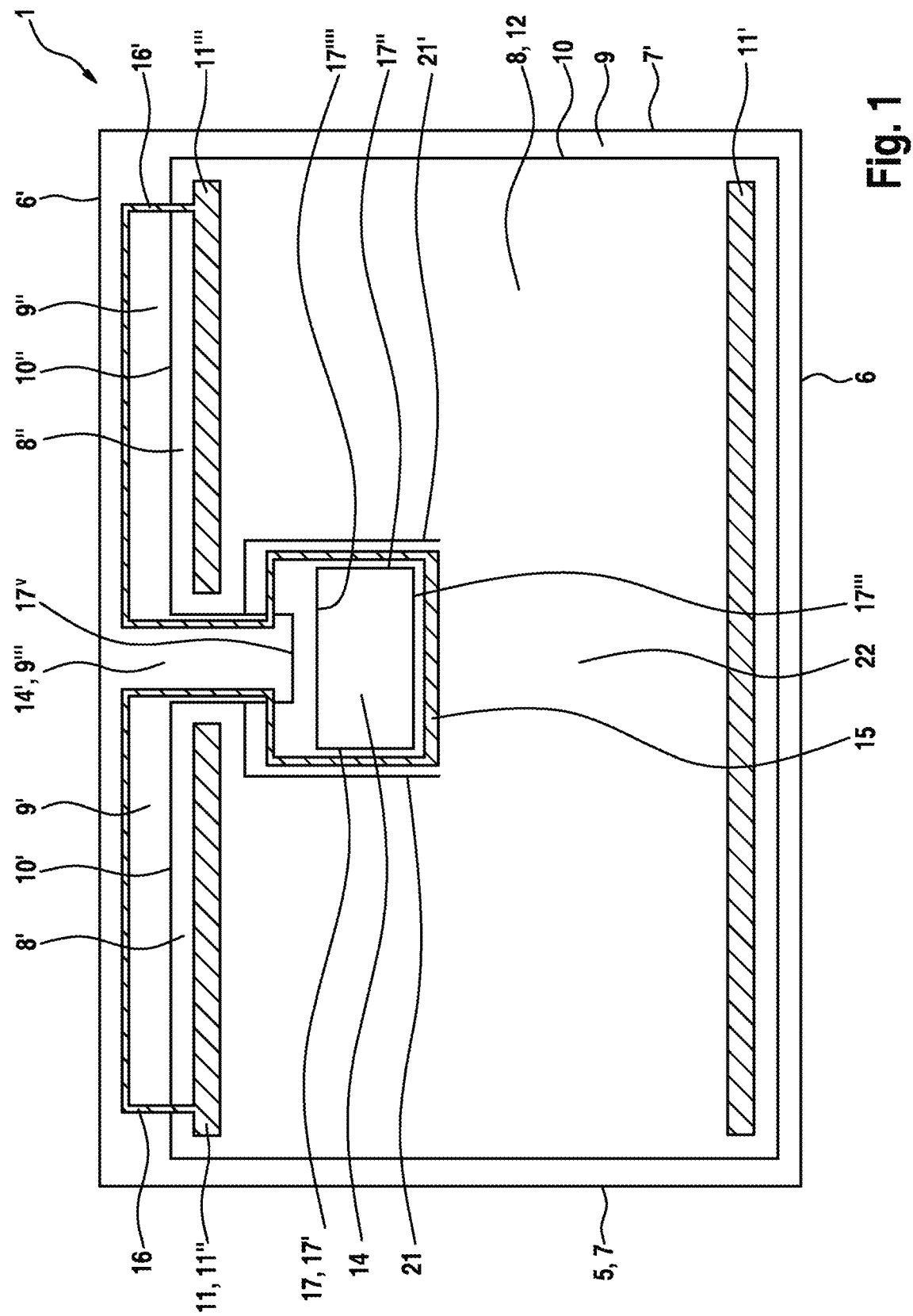
FIG. 1 a plan view of an exemplary embodiment of the windshield according to the invention in simplified representation.

In the FIGS. 1 to 12 the reference characters have the following meaning:

1 windshield
2 outer pane
3 inner pane
4 adhesive layer
5 pane edge
6, 6' first side
7, 7' second side
8 electrically conductive coating
8',8" subregion of the electrically conductive coating 8 outside the heating field 12
9 edge strip
9' zone of the edge strip 9 in the region of the zone 10' of the coating edge 10
9" zone of the edge strip 9 in the region of the zone 10" of the coating edge 10
9'" zone of the edge strip 9 associated with the first coating-free zone 14
10 coating edge
10',10" zone of the coating edge 10 in the region above the subregions 11",11'" of the collecting electrode 11
11, 11' collecting electrode
11",11'" subregion of the collecting electrode 11 or 11'
12 heating field 12' coupling field
13 masking strip
13' edge of the masking strip
14 first coating-free zone
14' second coating-free zone
14" part of the coating-free zone 14 above the collecting electrode 11
15 additional electrode
16, 16' electrical supply line
16" coupling line between collecting electrode 11 and electrical supply lines 16, 16'
16''' coupling electrode
17 zone edge of the first coating-free zone 14 formed by the electrically conductive coating 8
17',17" in the installed state of the windshield 1, lateral zone edge of the first coating-free zone 14, formed by the electrically conductive coating 8
17''' in the installed state of the windshield 1, lower zone edge of the first coating-free zone 14 formed by the electrically conductive coating 8
17"" in the installed state of the windshield 1, upper zone edge of the first coating-free zone 14 formed by the electrically conductive coating 8
17$v$ zone edge of the second coating-free zone 14' formed by the electrically conductive coating 8
18 flat conductor connected to one terminal of a voltage source
19, 19' electrically insulating layer
20, 20' connecting part between the flat conductor 18 and the collecting electrode
11, 11'
21, 21' coating-free line
22 heating field section of the heating field 12 between additional electrode 15 and a second collecting electrode 11 or 11'

DETAILED DESCRIPTION OF THE FIGURES

Figure 2:
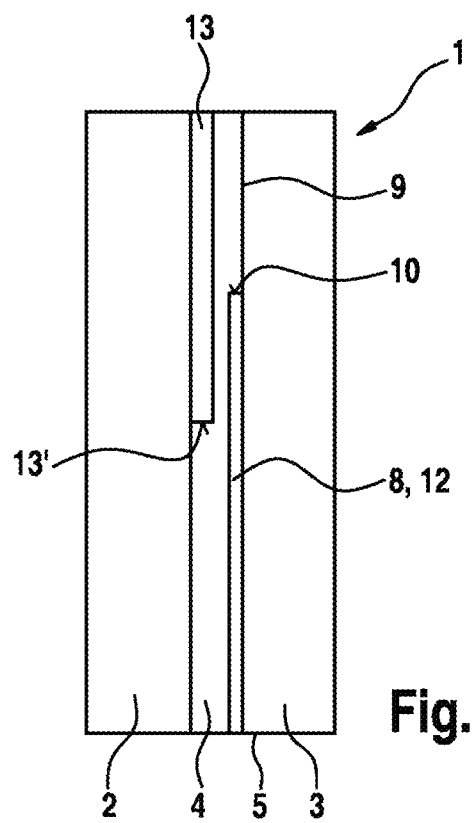
FIG. 2 a representation of a vertical cut through a detail of the windshield according to the invention of FIG. 1.
Figure 3:
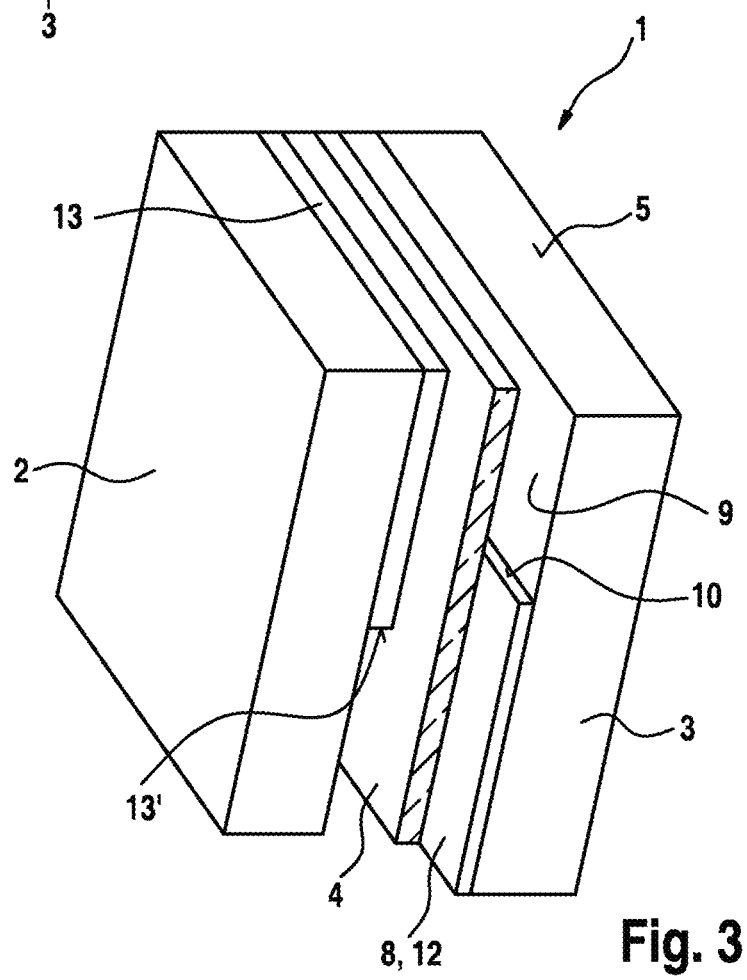
FIG. 3 a perspective cross-sectional view of a detail of the windshield of FIG. 1.
Figure 5:
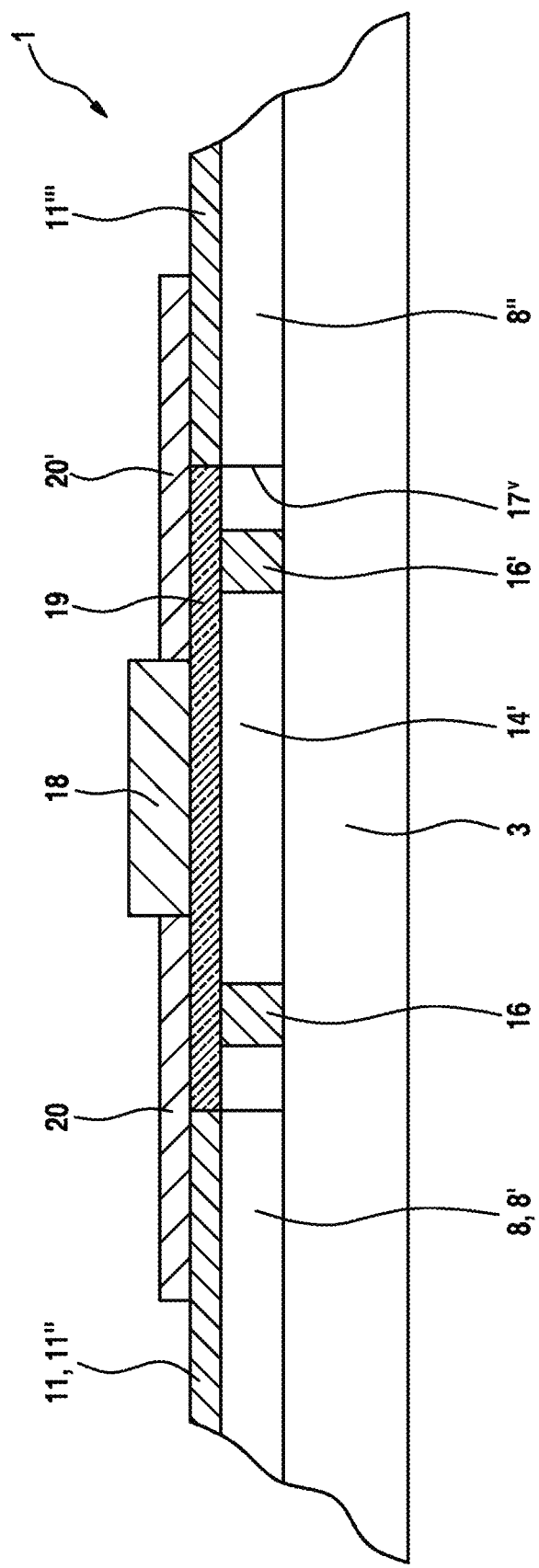
FIG. 5 a representation of a vertical section through a detail of the windshield according to the invention of FIG. 4.

FIG. 1 in Conjunction with FIGS. 2, 3, and 5

FIG. 1 depicts a transparent windshield 1 of a motor vehicle viewed from the inside in a simplified representation. Here, the windshield 1 is implemented, for example, as a laminated glass pane whose structure is illustrated using the representation of a vertical cut through a detail of the windshield 1 in FIG. 2 and using the perspective sectional view of a detail of the windshield 1 in FIG. 3.

Accordingly, the windshield 1 comprises two rigid individual panes, namely an outer pane 2 and an inner pane 3, which are adhesively bonded to each other by a thermoplastic adhesive layer 4, here, for example, a polyvinyl butyral film (PVB), an ethylene vinyl acetate film (EVA), or a polyurethane film (PU). The two individual panes 2, 3 are roughly the same size and shape and can, for example, have a trapezoidal curved outline, which is not shown in detail in the figures. They are made, for example, of glass, being also possibly made of a nonglass material such as plastic. For applications other than windshields, it would also be possible to produce the two individual panes 2, 3 from a flexible material. The outline of the windshield 1 is defined by a pane edge 5 common to the two individual panes 2, 3, with the windshield 1 having, at the top and bottom, two opposing first sides 6, 6' as well as, on the left and on the right, two opposing second sides 7, 7'.

As depicted in FIGS. 2 and 3, a transparent, electrically conductive coating 8 is deposited on the side of the inner pane 3 bonded to the adhesive layer 4. Here, the heatable, electrically conductive coating 8 is, for example, applied substantially on the entire surface of the inner pane 3, with an edge strip 9 of the inner pane 3 circumferential on all sides not coated such that a coating edge 10 of the electrically conductive coating 8 is set back inward relative to the pane edge 5. This effects electrical isolation of the electrically conductive coating 8 toward the outside. In addition, the electrically conductive coating 8 is protected against corrosion penetrating from the pane edge 5.

The electrically conductive coating 8 comprises, in a manner known per se, a layer sequence (not shown) with at least one electrically heatable, metallic sublayer, preferably silver, and, optionally, other sublayers such as anti-reflection layers and blocker layers. The layer sequence advantageously has high thermal stability such that it withstands without damage, the temperatures of typically more than 600° C. necessary for bending glass panes; however, layer sequences with low thermal stability can also be provided. The electrically conductive coating 8 can also be applied as a metallic single layer. It is also conceivable not to apply the electrically conductive coating 8 directly on the inner pane 3, but instead to apply it first on a carrier, for example, a plastic film that is subsequently bonded with the outer and inner pane 2, 3. Alternatively, the carrier film can be bonded to adhesive films (e.g., PVB films) and bonded as a three layer arrangement (trilayer) to inner and outer pane 2, 3. The heatable, electrically conductive coating 8 is preferably applied by sputtering or magnetron cathodic sputtering onto the inner or outer pane 2, 3.

As depicted in FIG. 1, the electrically conductive coating 8 is electrically conductively connected adjacent the two first sides 6, 6', i.e., at the upper and lower pane edge 5, to a band-shaped upper collecting electrode or busbar 11 and a band-shaped lower collecting electrode 11' and, for example, for this purpose, galvanically coupled to the two collecting electrodes 11, 11'. The upper collecting electrode 11 is provided for connecting to one terminal of a voltage source (not shown). The two collecting electrodes 11, 11' of opposite polarity serve for uniform introduction and distribution of the heating current in the heating field 12 of the heatable coating 8, situated therebetween. The two collecting electrodes 11, 11' are, for example, printed onto the electrically conductive coating 8 and have, in each case, an at least approx. straight linear course.

Preferably, the upper collecting electrode 11 is subdivided into two subregions 11" and 11''' separated from one another.

From each of the two subregions 11",11''', in each case, an electrical supply line 16, 16' runs to an additional electrode 15. The electrical supply lines 16, 16' run a short distance through the subregions 8',8" laid outside the heating layer 12 above the two subregions 11" and 11'''. Thereafter, the electrical supply lines 16, 16' run a longer distance through the coating-free zones 9',9" of the coating-free edge strip 9 adjacent the upper first side 6' of the windshield 1 in the region of the zones 10',10" of the coating edge 10 to the upper, second coating-free zone 14', which forms, with the coating-free zones 9',9", a common coating-free zone 14',9', 9".

From there, the two electrical supply lines 16, 16' run within the coating-free zone 14',9', 9" along the lateral zone edges 17$^V$ formed by the electrically conductive coating 8 all the way into the lower region of the second coating-free zone 14'. From there out, they traverse the lateral zone edges 17$^V$ and run further via the heating field 12 of the electrically conductive coating 8.

Below the upper, second coating-free zone 14', a lower, first coating-free zone 14 with a zone edge 17 formed by the electrically conductive coating 8 is arranged. The zone edge 17 comprises two lateral edges 17',17", a lower zone edge 17'" associated with the additional electrode 15, and an upper zone edge 17"" associated with the second coating-free zone 14'.

The electrical supply lines 16, 16' run further in the heating field 12 along the lateral zone edges 17',17", with the electrical supply line 16 associated with the lateral zone edge 17' and the electrical supply line 16' associated with the lateral zone edge 17". They end at the two lateral ends of the additional electrode 15 associated with the lower zone edge 17'".

The additional electrode 15 is galvanically coupled to the heating field section 22 of the heating field 12 between the additional electrode 15 and the lower collecting electrode 11'.

The coating-free zones 14, 14' have here, for example, an at least approx. rectangular contour. They are transparent at least to a part of the electromagnetic spectrum (e.g., IR radiation, radio waves in the ultrashort, short, and longwave range), to enable unobstructed data traffic through the windshield 1. The coating-free zone 14, 14' can be produced, for example, by prior masking at the time of the application of the electrically conductive coating 8 on the inner pane 3. Alternatively, it can also be produced after application of the electrically conductive coating 8 by chemical and/or mechanical ablation, for example, by etching or use of a friction wheel.

The subregions 11",11'", the lower collecting electrode 11', the additional electrode 15, and the electrical supply lines 16, 16' can be produced by printing, for example, using a screen printing method, a metallic printing paste, for example, silver printing paste, onto the subregions 8',8" of the electrically conductive coating 8, the coating-free edge strip 9, and the coating-free zones 14, 14', preferably in one process step.

The electrical connection of the two subregions 11",11'" to a terminal of the voltage source (not shown) is made via a common, electrically conductive, metallic connecting part 20, which connects the two subregions 11",11'" to a conventional, known flat conductor 18. The arrangement comprising the flat conductor 18 and connecting part 20 is electrically isolated by a strip-shaped, electrically insulating layer 19 (not shown) from the sections of the electrical supply lines 16, 16' running thereunder. The strip-shaped, electrically insulating layer 19 runs between the two subregions 11",11'" and can abut their end edges. At least, however, it covers the intersection points of the electrical supply lines 16, 16' with the connecting part 20 (not shown). For additional details, reference is made to FIGS. 4 and 5.

According to the invention, along the sections of the two electrical supply lines 16, 16' in the heating field 12 at a constant small distance therefrom, a continuous coating-free line 21, 21' of a constant width of 500 µm produced by laser ablation runs, in each case, all the way to the two lateral ends of the additional electrode 15.

By means of the arrangement according to the invention of the electrical supply lines 16, 16' and of the coating-free lines 21, 21', the formation of hotspots upon application of a supply voltage and with relatively long operation is effectively prevented in the transparent pane 1 of FIG. 1 according to the invention.

Figure 4:
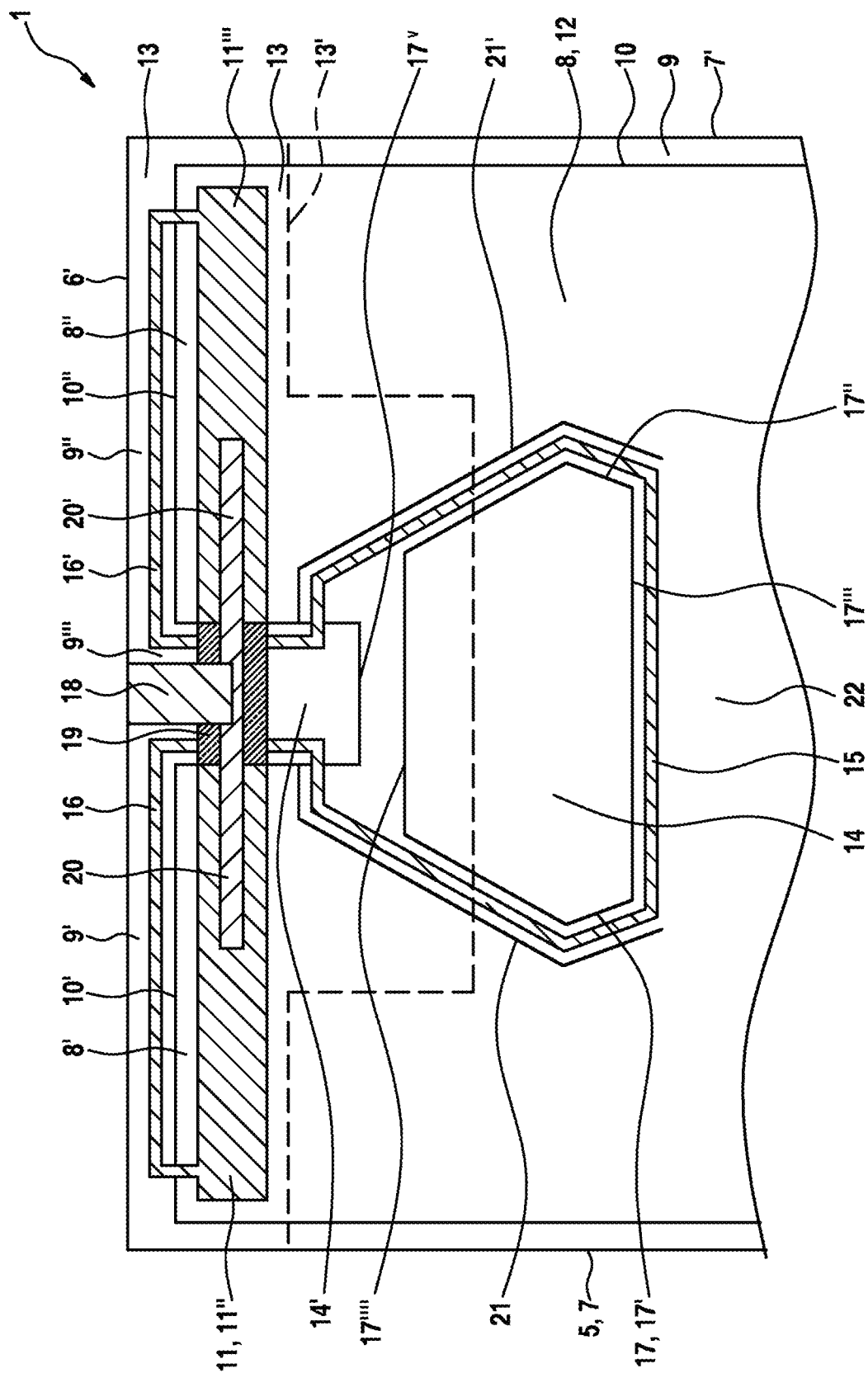
FIG. 4 a plan view of a detail of the exemplary embodiment of the windshield according to the invention of FIG. 1.

FIG. 4 in Conjunction with FIG. 5

FIG. 4 depicts the plan view of a detail of the exemplary embodiment of the windshield 1 according to the invention of FIG. 1.

The detail depicts the upper region of the windshield 1 according to the invention of FIG. 1. In contrast to FIG. 1, the lower, first coating-free zone 14 has an asymmetric hexagonal contour. According to the invention, the associated sections of the electrical supply lines 16, 16' and the continuous coating-free lines 21, 21' associated therewith follow this contour.

Moreover, the arrangement comprising flat conductor 18, electrically conductive connecting part 20, electrically isolating strip 19, and associated sections of the two electrical supply lines 16, 16' arranged centrally between the two lateral edges of the subregions 11",11'" in the upper second coating-free zone 14' is sketched in This arrangement is again further illustrated with reference to FIG. 5. FIG. 5 depicts a vertical section through the arrangement in the region of the upper, second coating-free zone 14' comprising inner pane 3, subregions 8',8" the electrically conductive coating 8 with the zone edges $17^V$, subregions 11",11'", electrically insulating strip 19, flat conductor 18 lying thereon, and adjacent subregions 20, 20' of the connecting part 20.

In another embodiment, the strip-shaped electrically insulating layer does not abut the end edges of the subregions 11",11'", but, instead, covers only the intersections of the electrical supply lines 16, 16' with the connecting parts 20, 20'.

The region of the windshield 1 in which the above-described functional elements are situated as well as parts of the heating field 12 are concealed by black, opaque masking strips 13 with the edge 13' and thus visually masked. The masking strips also serve for shielding against UV radiation, which could negatively affect the functions of the electrically conductive elements.

FIGS. 6 through 12 in Conjunction with FIGS. 2 and 3

FIGS. 6 through 12 depict other advantageous embodiments of the windshield 1 in simplified representation.

In the simplified representation, some characteristics that are depicted in detail in FIGS. 1, 4, and 5 are omitted for the sake of greater clarity, such that the characteristics primarily characterizing the embodiments of FIG. 6 through 12 are more prominent.

The outline of the windshield 1 usually used in practice is indicated by the trapezoidal shape of the windshield 1 of FIG. 6 through 12.

The windshields 1 of FIG. 6 through 12 also have the structure depicted in FIGS. 2 and 3. They are constructed from the same materials as the windshields of FIGS. 1 and 4.

Consequently, in the following, the description of the windshields 1 of FIG. 6 through 12 can be limited to the respective primarily characterizing features.

FIG. 6

Figure 6:
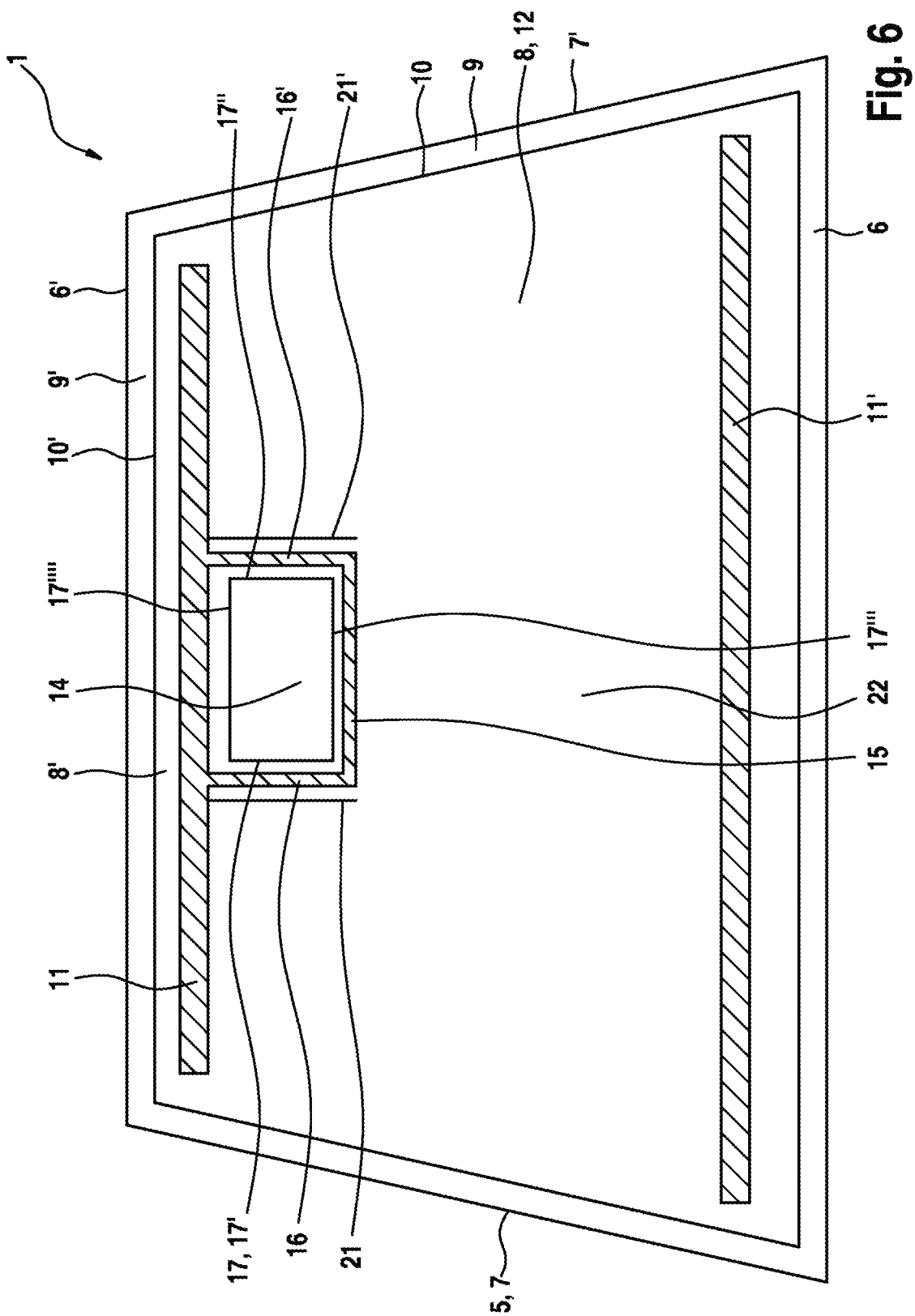
FIG. 6 a plan view of another exemplary embodiment of the windshield according to the invention in simplified representation.

The windshield 1 of FIG. 6 has a continuous collecting electrode 11. Below the collecting electrode 11, the (first) coating-free zone 14 with the zone edges 17 is centrally arranged in the heating field 12. Two electrical supply lines 16, 16' branch off from the collecting electrode 11 and run in the heating field 12 along the lateral zone edges 17',17" all the way to the additional electrode 15, which extends along the lower zone edge 17'" in the heating field 12 and is in electrical contact with the heating field section 22.

Along the electrical supply lines 16, 16', on their sides turned away from the lateral zone edges 17',17", runs, in each case, a continuous coating-free line 21, 21' from the collecting electrode all the way to the level of the additional electrode 15.

FIG. 7

Figure 7:
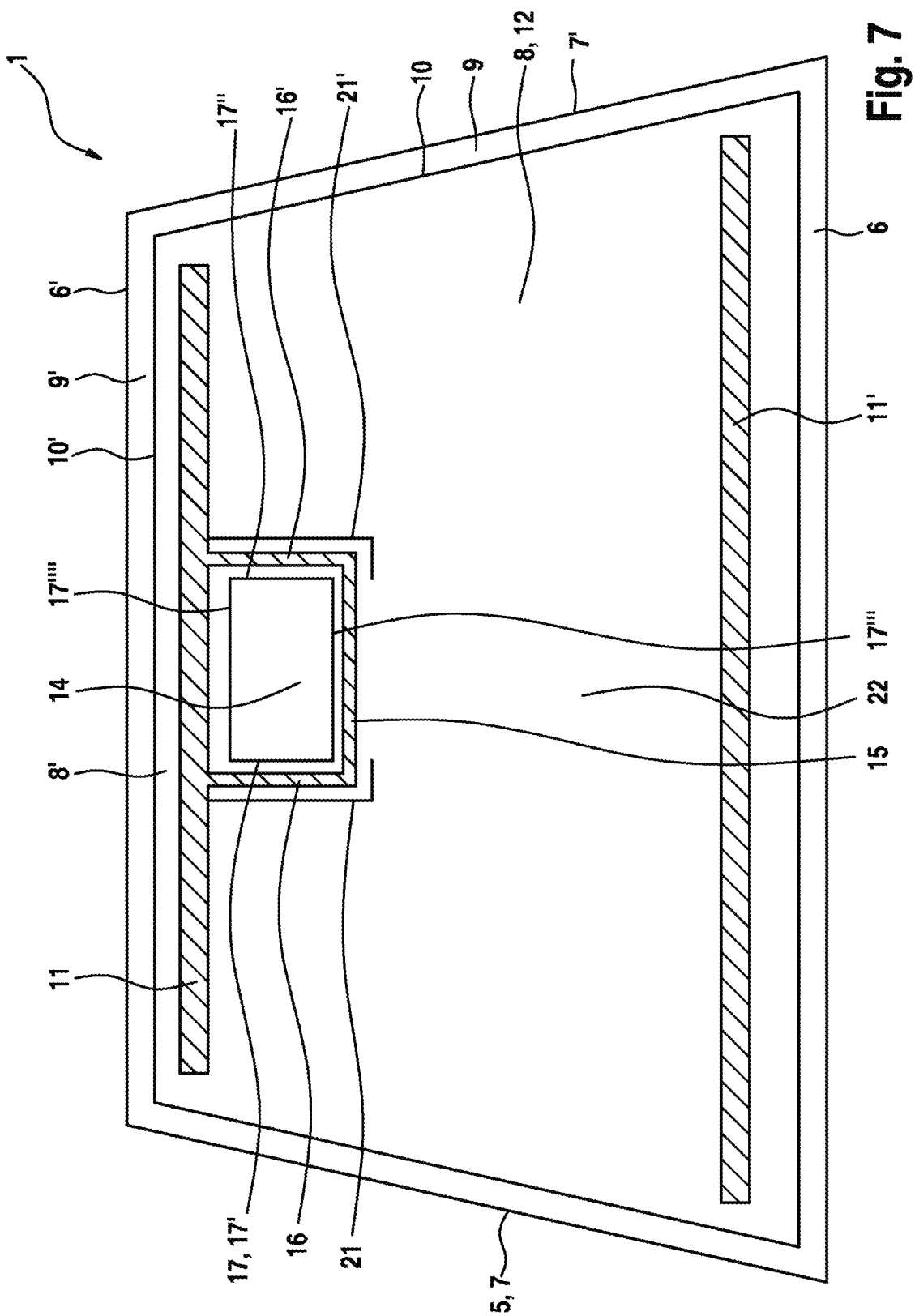
FIG. 7 a plan view of another exemplary embodiment of the windshield according to the invention in simplified representation.

The windshield 1 of FIG. 7 differs from that of FIG. 6 only in that the continuous coating-free lines 21, 21' in the heating field section 22 run, in each case, a short distance farther along the additional electrode 15.

FIG. 8

Figure 8:
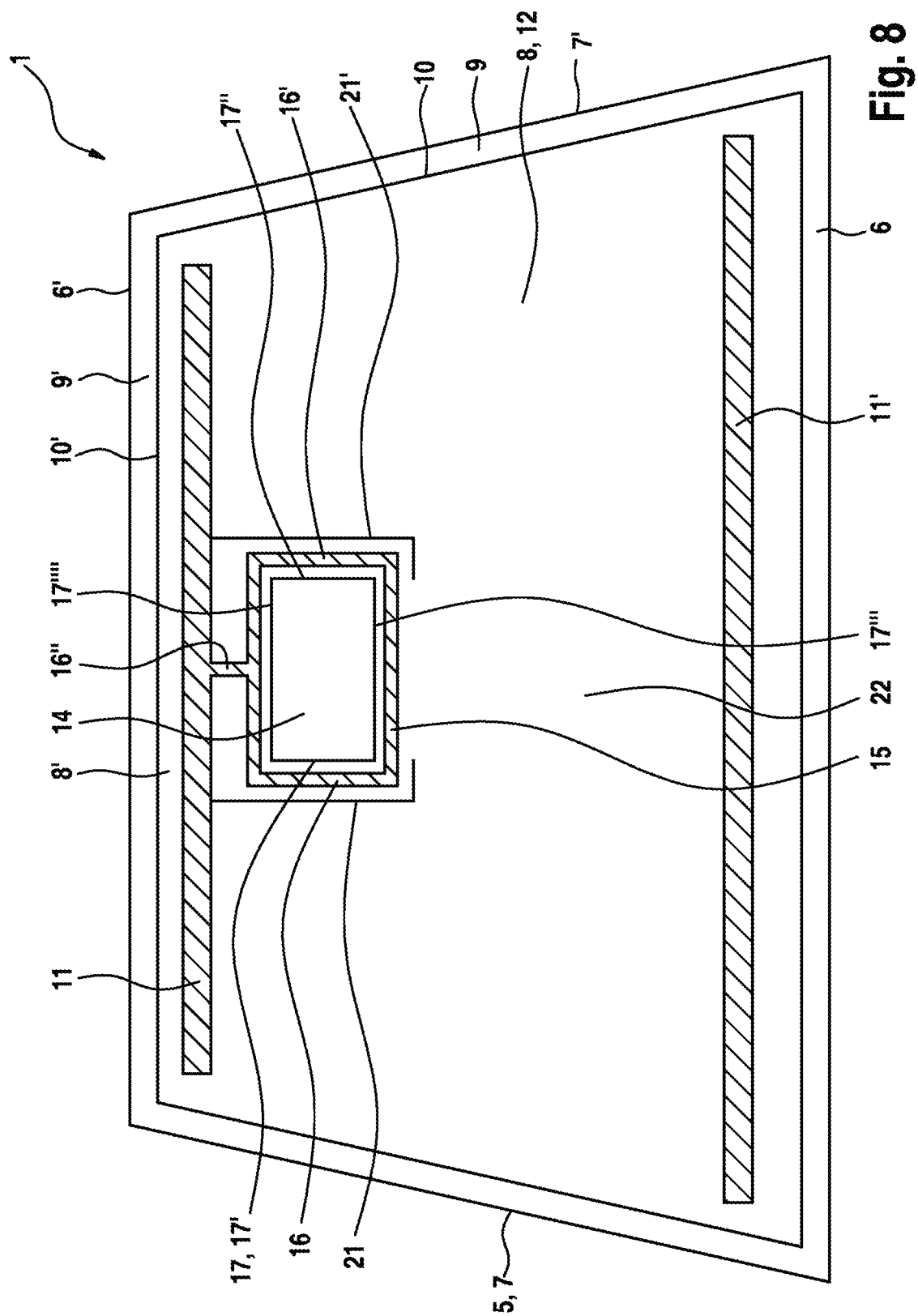
FIG. 8 a plan view of yet another exemplary embodiment of the windshield according to the invention in simplified representation.

The windshield 1 of FIG. 8 also has a continuous collecting electrode 11. Below the collecting electrode 11, a (first) coating-free zone 14 is likewise arranged centrally. In contrast to the windshield of FIG. 7, the coupling line 16" branches from the center of the collecting electrode, which coupling line supplies the electrical supply lines that are guided around the zone edges 17"", 17', and 17" all the way to the additional electrode 15 with current. The configuration of the continuous coating-free lines 21, 21' corresponds to that of the windshield 1 of FIG. 7.

FIG. 9

Figure 9:
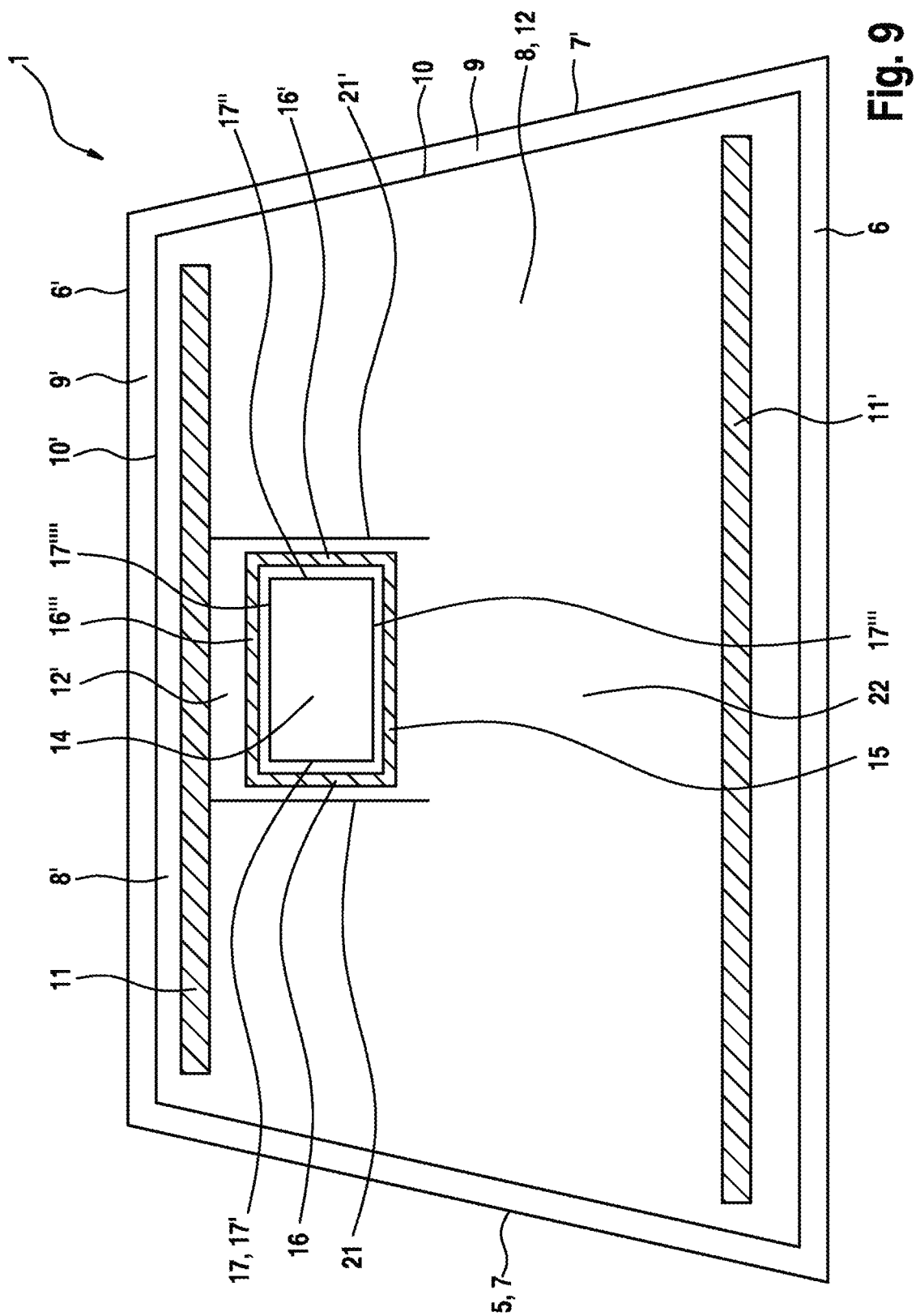
FIG. 9 a plan view of yet another exemplary embodiment of the windshield according to the invention in simplified representation.

The windshield 1 of FIG. 9 likewise has a continuous collecting electrode 11. In contrast to the windshield 1 of FIG. 8, it has no coupling line 16", but, instead, the electrical contact or the galvanic coupling between the collecting electrode 11 and the electrical supply lines 16, 16' is produced by means of a coupling electrode 16'" running parallel to the collecting electrode 11 and a coupling field 12' arranged therebetween in the heating field 12. The coupling electrode 16'" runs along the upper zone edge 17"" of the (first) coating-free zone 14 in the heating field 12. The two electrical supply lines 16, 16' run in the heating field 12 along the lateral zone edges 17',17" all the way to the additional electrode 15 running along the lower zone edge 17'" in the heating field 12.

The two continuous coating-free lines 21, 21' are arranged, as in the windshield 1 of FIG. 6, except that they extend a certain distance farther into the heating field section 22.

FIG. 10

The configuration of the windshield 1 of FIG. 10 corresponds to that of FIG. 9, except that the continuous coating-free lines 21, 21' begin not at the collecting electrode 11, but, rather, at the level of the coupling electrode 16'".

FIG. 11

The windshield 1 of FIG. 11 likewise has a continuous collecting electrode 11. In contrast to the windshields 1 of FIGS. 6 to 10, it has, centrally, a (first) coating-free zone 14, which forms, with the coating-free edge strip 9'" associated therewith, a unified coating-free zone. The collecting electrode 11 is guided through this coating-free zone such that the subregions 8',8" of the electrically conductive coating 8 situated outside the heating field 12 with the zones 9',9" associated therewith of the edge strip 9 and 10',10" of the coating edge 10 are situated above the collecting electrode 11.

Otherwise, the configuration of the electrical supply lines 16, 16' of the additional electrode 15 and the continuous coating-free lines 21, 21' corresponds to the configuration of the windshield of FIG. 7.

FIG. 12

The windshield 1 of FIG. 12 corresponds to the windshield 1 of FIG. 11, with the significant difference that the collecting electrode 11 has two subregions 11",11'" spatially separated from one another. The inner ends abut the lateral zone edges 17',17" of the coating-free zone 14, 9'". The two subregions 11",11'" are electrically connected to one another via the electrical supply lines 16',16" respectively associated therewith and the additional electrode 15.

Otherwise, the configuration of the continuous coating-free lines 21, 21 corresponds to that of the windshield 1 of FIG. 11.

By means of the arrangement according to the invention of the electrical supply lines 16, 16' and the coating-free lines 21, 21', the formation of hotspots upon application of a supply voltage and with relatively long operation is also effectively prevented with the windshields 1 according to the invention of FIGS. 6 to 12.

The invention claimed is:

1. A transparent pane comprising:
at least one heatable, electrically conductive coating connected to at least two collecting electrodes configured to establish an electrical connection to two terminals of a voltage source, so that an applied supply voltage of the voltage source causes a heating current to flow via a heating field formed between the at least two collecting electrodes, wherein the heating field contains at least one coating-free zone bordered by a zone edge that is formed at least in sections by the electrically conductive coating, wherein at least one collecting electrode of the at least two collecting electrodes is electrically connected via at least two electrical supply lines to at least one additional electrode, wherein at least one electrical supply line of the at least two electrical supply lines runs, at least in sections, in the heating field wherein the at least one additional electrode electrically connects the at least two electrical supply lines to one another, and/or wherein the at least one additional electrode is subdivided into at least two subregions separated from one another, wherein each of the at least two subregions is electrically connected to at least one of the electrical supply lines, and wherein in the heating field, at least one coating-free line runs at least in sections along at least one of the electrical supply lines, on a side facing away from the at least one coating-free zone, wherein the at least one coating-free line runs out from one collecting electrode through the heating field all the way to a level of the additional electrode or all the way to a level of the subregions of the additional electrode, or the at least one coating-free line runs out from one collecting electrode of the at least two collecting electrodes through the heating field all the way to the level of the additional electrode or to the level of the subregions of the additional electrode and from there out in sections through the heating field section along the additional electrode or longest subregions of the additional electrode, or the at least one coating-free line begins in the heating field at a certain distance from the collecting electrode, wherein at least one collecting electrode of the at least two collecting electrodes is subdivided into at least two subregions separated from one another, wherein each of the at least two subregions of the at least two collecting electrodes is electrically connected via at least one of the electrical supply lines to the at least one additional electrode or to at least one of the subregions of the at least one additional electrode, and wherein each of the at least two subregions of the at least one collecting electrode is electrically conductively connected to one of at least two flat conductors, wherein the at least two flat conductors are electrically conductively connected to one of the two terminals of the voltage source, or wherein the at least two subregions of the at least one collecting electrode are electrically conductively connected to a common flat conductor via a common connecting part or via one of two connecting parts, wherein the common flat conductor and the common connecting part or the two connecting parts are arranged electrically isolated from the at least two electrical supply lines.

2. The transparent pane according to claim 1 wherein the at least one coating-free line runs at least in sections in a straight line, in a shape of a wave, a meander, a sawtooth, and/or a zigzag.

3. The transparent pane according to claim 1, wherein the at least one coating-free line runs at least in sections continuously and/or as a broken line with discrete breaks.

4. The transparent pane according to claim 1, wherein the at least one coating-free line is produced by laser application on the electrically conductive coating of the heating field.

5. The transparent pane according to claim 1, wherein the at least two electrical supply lines are electrically connected to at least one collecting electrode of the at least two collecting electrodes and/or to at least one of the at least two subregions of the at least one collecting electrode separated from one another, and wherein a corresponding electrical connection is provided by way of one or more of: a) a direct connection, b) a coupling line, and c) a coupling field and at least one coupling electrode.

6. The transparent pane according to claim 1, wherein:
a) the at least one coating-free zone and at least one zone of a coating-free edge strip associated therewith form a unified coating-free zone on an upper first side of the transparent pane, or
b) at least one second coating-free zone is arranged above an upper zone edge of the at least one coating-free zone, wherein:

the at least one second coating-free zone is surrounded by a zone edge formed by the electrically conductive coating, or the at least one second coating-free zone and the at last one zone of the coating-free edge strip associated therewith form a unified coating-free zone on an upper first side of the transparent pane.

7. The transparent pane according to claim 1, wherein the at least one additional electrode and/or the at least two subregions of the at least one additional electrode is/are arranged along a lower zone edge of the at least one first coating-free zone in electrically conductive contact with the heating field.

8. The transparent pane according to claim 1, wherein the at least one electrical supply line runs in sections, in at least one subregion of the electrically conductive coating outside the heating field, through at least one zone of an edge strip in the region of at least one zone of the coating edge, below at least one electrically insulating layer, on which a flat conductor and at least one connecting part are arranged between the flat conductor and the at least two subregions of the at least one collecting electrode, inside a zone edge of at least one second coating-free zone or formed by the electrically conductive coating, through the heating field, and along at least one lateral zone edge of the at least one first coating-free zone, to the at least one additional electrode.

* * * * *